United States Patent
Hu et al.

(10) Patent No.: US 8,030,684 B2
(45) Date of Patent: Oct. 4, 2011

(54) MESA-TYPE PHOTODETECTORS WITH LATERAL DIFFUSION JUNCTIONS

(75) Inventors: Syn-Yem Hu, San Jose, CA (US); Zhong Pan, San Jose, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 141 days.

(21) Appl. No.: 12/174,079

(22) Filed: Jul. 16, 2008

(65) Prior Publication Data
US 2009/0020841 A1 Jan. 22, 2009

Related U.S. Application Data

(60) Provisional application No. 60/950,437, filed on Jul. 18, 2007.

(51) Int. Cl.
*H01L 31/107* (2006.01)
(52) U.S. Cl. .............. 257/186; 257/442; 257/E31.005; 438/72
(58) Field of Classification Search .................. 257/184, 257/186, 442, E31.005, E31.006; 438/72
See application file for complete search history.

(56) References Cited

U.S. PATENT DOCUMENTS

| | | | |
|---|---|---|---|
| 5,543,629 A | 8/1996 | Nakamura et al. | |
| 5,552,629 A * | 9/1996 | Watanabe | 257/438 |
| 5,610,416 A | 3/1997 | Su et al. | |
| 5,712,504 A | 1/1998 | Yano et al. | |
| 5,843,804 A | 12/1998 | Su et al. | |
| 5,866,936 A * | 2/1999 | Hasnain et al. | 257/452 |
| 6,229,162 B1 | 5/2001 | Watanabe et al. | |
| 6,515,315 B1 | 2/2003 | Itzler | |
| 6,635,908 B2 * | 10/2003 | Tanaka et al. | 257/186 |
| 6,706,542 B1 | 3/2004 | Geva et al. | |
| 6,753,214 B1 | 6/2004 | Brinkmann et al. | |
| 6,756,613 B2 | 6/2004 | Yuan | |
| 6,800,914 B2 | 10/2004 | Ito et al. | |
| 7,020,375 B2 | 3/2006 | Nakaji et al. | |
| 7,031,587 B2 | 4/2006 | Nakaji et al. | |
| 7,038,251 B2 | 5/2006 | Ishimura et al. | |
| 7,105,369 B2 | 9/2006 | Yuan | |
| 7,187,013 B2 | 3/2007 | Nakaji et al. | |
| 7,259,408 B2 | 8/2007 | Yagyu | |
| 7,348,607 B2 | 3/2008 | Ko | |
| 7,348,608 B2 | 3/2008 | Ko | |
| 2002/0070384 A1 * | 6/2002 | Clark et al. | 257/79 |

(Continued)

OTHER PUBLICATIONS

"Investigation of Guardring-Free Planar AlInAs Avalanche Photodiodes" Yagyu et al, IEEE Photonics Tech. Ltrs, vol. 18, No. 11, Jun. 1, 2006, pp. 1264-1266.

(Continued)

*Primary Examiner* — Wael Fahmy
*Assistant Examiner* — John C Ingham
(74) *Attorney, Agent, or Firm* — Matthew A. Pequignot; Pequignot + Myers LLC (57) ABSTRACT

The present invention relates to a stable mesa-type photodetector with lateral diffusion junctions. The invention has found that without resorting to the complicated regrowth approach, a simple Zn diffusion process can be used to create high-quality semiconductor junction interfaces at the exposed critical surface or to terminate the narrow-bandgap photon absorption layers. The invention converts the epi material layers near or at the vicinity of the etched mesa trench or etched mesa steps into a different dopant type through impurity diffusion process. Preferably the diffused surfaces are treated with a subsequent surface passivation. This invention can be applied to both top-illuminating and bottom-illuminating configurations.

11 Claims, 6 Drawing Sheets

U.S. PATENT DOCUMENTS

2005/0224839 A1    10/2005    Yagyu

OTHER PUBLICATIONS

A New Planar InGaAs-InAlAs Avalanche Photodiodes: Levine et al, IEEE Photonics Tech. Ltrs, vol. 18, No. 11, Sep. 15, 2006, pp. 1898-1900.

"Recent Advances in AlInsAs Avalanche Photodiodes", Yagyu et al, OFC 2007, OThG2.

Simple Planar Structure for High-Performance AlInAs Avalance Photodiodes: Yugyu et al, IEEE Photonics Tech. Ltrs, vol. 18, No. 11, Jan. 1, 2006, pp. 76-78.

"-29dBm Sensitivity, InAlAs APD-Based Receiver for 10Gb/s Long-Haul (LR-2) Applications" Levine et al, OFC 2005 OFM5.

"High Reliability and Low-Dark-Current 10-Gb/s Planar Superlattice Avalanche Photodiodes" Watanabe et al, IEEE Photonics Tech. Ltrs, vol. 9, No. 12, Dec. 1997, pp. 1619 1621.

"Microlens-Integrated Large-Area InAlGaAs-InAlAs Superlattice APD's for Eye-Safety 1.5-μm Wavelength Optical Measurement Use", Hayashi et al, IEEE Photonics Tech. Ltrs, vol. 10, No. 4, Apr. 1998, pp. 576-578.

"High-Speed, High-Reliability Planar-Structure Superlattice Avalanche Photodiodes for 10-Gb/s Optical Receivers", Watanabe et al, Journal of Lightwave Tech. vol. 18, No. 12, Dec. 2000, pp. 2200-2207.

"Buried-Mesa Avalanche Photodiodes", Hasnain et al, IEEE Journal of Quantum Electronics, Vo.. 34, No. 12, Dec. 1998, pp. 2321-2326.

"High-Speed Flip-Chip InP/InGaAs Avalanche Photodiodes with Ultralow Capacitance and Large Gain-Bandwidth Products", Kito et al, IEEE Transactions Photonics Tech. Ltrs vol. 3, No. 12, Dec. 1991, pp. 1115-1116.

"Reliability of Mesa-Structure InAlGaAs-InAlAs Superlattice Avalanche Photodiodes", Watanabe et al, IEEE Photonics Tech. Ltrs, vol. 8, No. 6, Jun. 1996, pp. 824-826.

"A New Planar-Structure InAlGaAs-InAlAs Superlattice Avalanche Photodiode with a Ti-Implanted Guard-Ring", Watanabe et al, IEEE Photonics Tech. Ltrs, vol. 8, No. 6, Jun. 1996, pp. 827-829.

* cited by examiner

MESA-TYPE PHOTODETECTORS WITH LATERAL DIFFUSION JUNCTIONS

CROSS-REFERENCE TO RELATED APPLICATIONS

This application claims priority from U.S. provisional application No. 60/950,437 filed Jul. 18, 2007, herein incorporated by reference.

TECHNICAL FIELD

The present application relates to a mesa-type PIN photodiode with additional dopant diffusion incorporated within or near the mesa trench to provide termination to the sensitive small-bandgap absorption layers, and to a method for making mesa-type PIN photodiodes to improve the reliability of passivation of the absorption layers.

BACKGROUND OF THE INVENTION

Mesa-type photodiodes offer a number of advantages over planar avalanche photodiodes (APD), including reduced capacitance and increased bandwidth. However, mesa-type photodiodes suffer from poor reliability. This is due primarily to the structure which exposes the sensitive narrow bandgap absorption layer to foreign material such as air, SiN or other impurities.

Exposed narrow-bandgap photon absorption layer(s) on the etched sidewall of mesa-type PIN photodetectors imposes a great deal of reliability concern for almost all material systems, especially for InP/InGaAs PIN photodiodes (PDs) which are the primary candidates for long haul high data rate links. Passivation in the form of a non-conductive material coating is applied to seal the mesa walls, to give a stable, low dark current for reliable operation, and to form an insulating layer upon which to plate a bonding pad. Even though many efforts have been invested in the development of surface-passivation techniques to reduce the surface defects and traps, mesa-based PIN PDs have not yet been able to deliver satisfactory performance to pass the stringent Telcordia aging test.

However, in many cases, mesa-based PIN PD designs are the preferred configuration, such as for high-speed PIN PD arrays where a semi-insulating (S.I.) substrate is needed to reduce crosstalk noise between adjacent devices. Some higher speed applications also require mesa-based PIN PD designs to get higher bandwidth due to its lower parasitic capacitance.

The traditional methods of terminating the reliability-sensitive narrow-bandgap photon absorption layer(s) for PIN photodetectors are usually one of the following three categories. In a first method band gap layers are exposed to air only upon wafer sawing or cleaving into chips, i.e., no etched trench or mesa is formed within the chip area during the wafer processing. The reliability-sensitive narrow-bandgap photon absorption layer(s) extend to the edges of the chip without being etched, implanted, or diffused in any place within the chip area. The majority of the one-top-contact diffusion PINs are being made this way worldwide. The narrow-bandgap photon absorption layer(s) retains its integrity throughout the whole device area. A majority of the one-top-contact (no n-well) InP/InGaAs APDs are being made this way also, such as JDSU's U.S. Pat. No. 6,515,315. As for InAlAs/InGaAs APDs, there are two examples falling into this category. A first example is from Mitsubishi: OFC 2007 paper OThG2; PTL-18, p. 76 (2006); PTL-18, p. 1264 (2006); and Opt. Comm. 2005. Another example is from Multiplex: U.S. Pat. No. 7,105,369 and U.S. Pat. No. 6,756,613. But this method does not include mesa-type PDs.

In a second method, edge surfaces are exposed to air during trench or mesa etch but later the exposed surface(s) will be passivated by one or more of the following techniques: (a) epitaxial regrowth and (b) plasma enhanced chemical vapor deposition (PECVD) or sputtering dielectric film(s) such as $SiN_x$ or $SiO_2$, or spin-on polyimide or benzocyclobutene (BCB) film. A few examples of prior art using epitaxial regrowth include the following patents: Opnext: U.S. Pat. No. 6,800,914; Mitsubishi: US patent application no. 2005/0025443 and US patent application no. 2005/0047743; TriQuint: U.S. Pat. No. 6,706,542; Sunitomo: U.S. Pat. No. 5,712,504; and HP: Journal of Quantum Electronics 34, p. 2321 (1998), U.S. Pat. Nos. 5,610,416, and 5,843,804, and 5,866,936. Dielectric or BCB/polyimide passivation is used for the majority of two-top-contact mesa PINs or APDs including laboratory designs and commercial products. Four examples for InAlAs/InGaAs APDs are from Picometrix: OFC 2005 paper OFM5; PTL-18, p. 1898 (2006); and US patent application no. 2004/0251483; Mitsubishi: U.S. Pat. Nos. 7,187,013, and 7,038,251; Hitachi: U.S. Pat. No. 5,543, 629; and NEC: PTL-10, p. 576 (1998), PTL-8, p. 824 (1996), and PTL-3, 1115 (1991). The added steps for epitaxial regrowth add significant complexity and expense to photodiode manufacture. And dielectric coating or BCB alone has proven inconsistent in its ability to reduce dark current, and insufficient to meet data-com and telecom aging requirements.

A third method comprises passivation by ion implantation within the planar (mesa) surface or within the etched trench (es). Examples of prior art using this technique include: Mitsubishi: US patent application no. 2005/0224839, U.S. Pat. Nos. 7,038,251, 7,187,013, and US application no. 2005/0230706; Picometrix: US application no. 2004/0251483, and US application no. 2005/0156192; NEC: JLT-18, p. 2200 (2000); PTL-9, p. 1619 (1997); PTL-8, p. 827 (1996); and U.S. Pat. No. 6,229,162; and OCP: U.S. Pat. No. 6,753,214.

US application no. 2005/0224839 discloses an etched ring shaped trench surrounding the p-n junction with a Ti implant and diffused with Zn at the multiplication layer. This structure is for removing p-type characteristics and functions as a guard ring. U.S. Pat. No. 7,187,013 also requires an etched trench ring. Additional surface passivation is applied in the form of an AR coating over surfaces of the trench. US application no. 2005/0156192 rejects these previous designs. "An existing avalanche photodiode has an etched isolation ring which is etched down to expose the top of the high field avalanche region followed by a deep titanium implant to further isolated the high field region. This is then followed by a zinc diffusion to contact the p-type semiconductor region. This is a very complicated structure requiring critical etching and implant steps. In spite of these efforts, it is believed that the lifetime of this avalanche photodiode is ten times shorter than their standard planar avalanche photodiode and thus not sufficient for telecommunications use." US application no. 2005/0156192 then discloses a passivated side region of a "mini-mesa" formed by wet oxidation and subsequent surface passivation of BCB, SiO2, SiN etc. But this type of passivation is only appropriate for Al containing material.

Among all these practices in the prior art, only diffusion-created field termination and surface passivation together can deliver satisfactory reliability performance to meet the data-com and telecom requirements. It is desired to find a process for this combination of passivation techniques without adding complexity and cost.

Accordingly, a process to create a reliable passivation of etched mesa-type PD surfaces without adding expensive additional processing steps remains highly desirable.

A mesa-type PD which can provide the reliability of planar PD is also highly desirable.

SUMMARY OF THE INVENTION

The present invention has found that without resorting to the complicated regrowth approach, a simple Zn diffusion process can be used to create high-quality semiconductor junction interfaces at the exposed critical surface or to terminate the narrow-bandgap photon absorption layer(s). A key aspect of the invention is to convert the epitaxial material layer(s) near or at the vicinity of the etched mesa trench or etched mesa step(s) into a different dopant type through impurity diffusion process. The resultant lateral diffused p-n junction interface is known to be with much superior reliability than the traditional passivation methods with dielectric film(s) and/or BCB/polyimide, especially for the In(Al) GaAs/InP-based material system, for example.

This invention can be applied to both top-illuminating and bottom-illuminating configurations. For the bottom-illuminating scenario, there can be an etched lens on the substrate surface to facilitate light coupling to the device area and with a metal or dielectric reflector on the epi surface to enhance responsivity. For the top-illuminating case, there can be a DBR mirror stack grown at the bottom of the epitaxial layer stack to enhance responsivity, as well.

Accordingly, an object of the present invention is to provide a mesa-type PIN photodiode comprising: an epitaxial semiconductor layer structure including the following layers over a substrate: a buffer layer; an absorption layer; a grading layer; and a window layer; a mesa structure, including a light input window to a diffused p-n junction in the window layer, defined by a trench through the epitaxial layers, the mesa having sidewalls in the trench, and the side walls including a diffusion margin of p-type material terminating the lateral extent of the epitaxial layers of the mesa; a p-contact disposed for electrical contact to the p-n junction; and an n-contact disposed for electrical contact to the p-n junction.

Thus an aspect of the present invention provides a method of passivating the etched sidewalls of a mesa-type PIN photodiode comprising the steps of:

providing a passivation layer over an epitaxial semiconductor layer stack on a substrate including: a buffer layer, an absorption layer, a grading layer and a window layer;

opening a window in the passivation layer and etching a trench in the semiconductor layers to create a mesa;

diff-using a dopant into the trench to form a diffusion margin of p-type material in the sidewalls of the mesa;

opening a window in the passivation layer over the mesa;

diffusing a dopant in through the window over the mesa to create a diffused active region in the window layer comprising a light input window to a diffused p-n junction in the window layer,;

applying an anti-reflection coating over the light input window; and applying p- and n-metal contacts.

BRIEF DESCRIPTION OF THE DRAWINGS

Further features and advantages of the present invention will become apparent from the following detailed description, taken in combination with the appended drawings, in which:

FIG. 3A-E illustrate a process flow of schematic cross-sections for the manufacture of the embodiment of FIG. 2A;

It will be noted that throughout the appended drawings, like features are identified by like reference numerals.

DETAILED DESCRIPTION OF THE PREFERRED EMBODIMENT

Figure 1A:
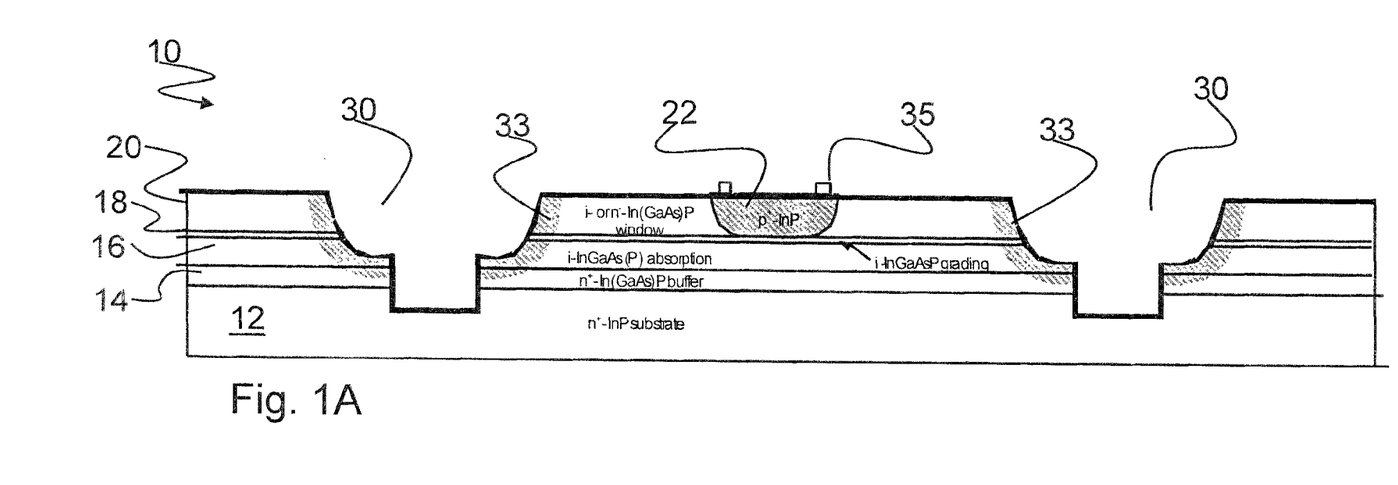
FIG. 1A is a schematic illustration of a mesa diffusion PIN photodiode with one top contact in accordance with the present invention, shown in cross-section.
Figure 1B:
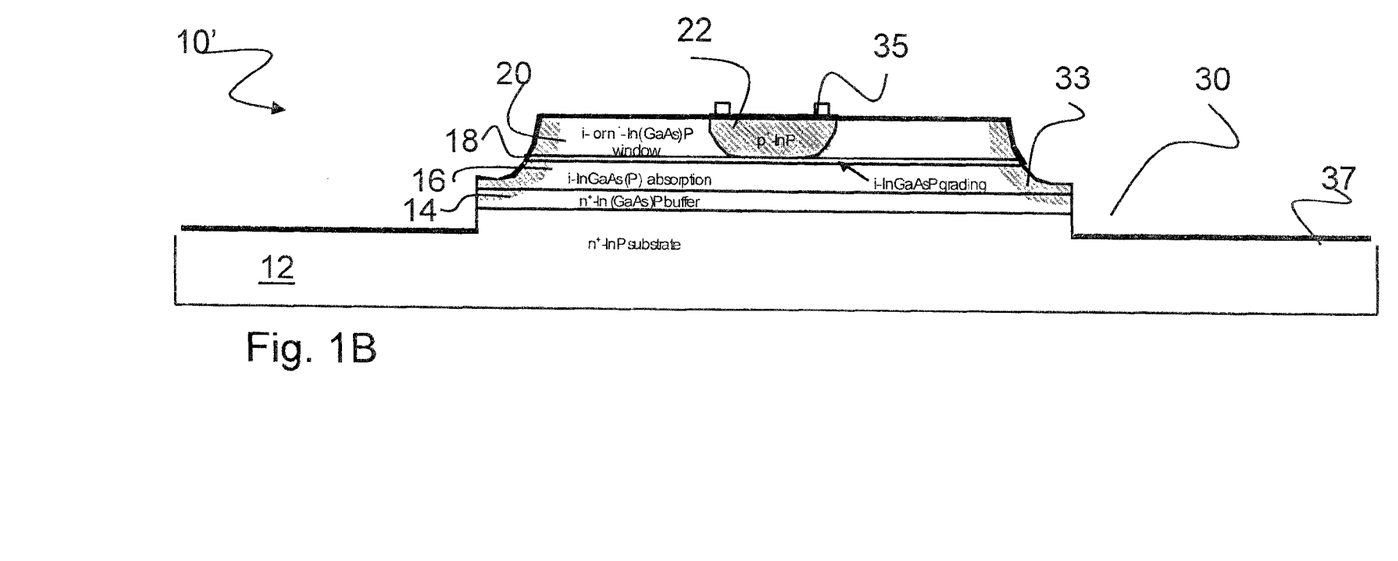
FIG. 1B is a schematic illustration of an alternative configuration of the photodiode shown in FIG. 1A, shown in cross-section.

The present invention provides a mesa-type diffused PIN photodiode as shown by example at 10 in FIG. 1A, which includes a diffused lateral p-n junction 33 to assist in passivation of the sensitive small-bandgap absorption layers. Photodiode 10 includes an epitaxial structure of the following layers: an n+InP substrate 12, an n+InP or InGaAsP buffer layer 14, an intrinsic InGaAs or InGaAsP absorption layer 16, an intrinsic InGaAsP grading layer 18, and an intrinsic or n−InGaAsP or InP window layer 20 with a diffused p-n junction of p+InP active region 22. The mesa is defined by a ring shaped trench 30. Peripheral material beyond the trench 30 is etched away or not depending on the desired bond pad placement (not shown), as is well understood in the art. Photodiode 10 has a single top contact, p contact 35. An n-metal contact (not shown) will be plated on the bottom surface of the substrate 12. FIG. 1B illustrates a similar mesa-type diffused PIN photodiode 10' in which the peripheral material beyond the trench 30 has been removed to create a bond pad region 37 on the substrate 12. In both embodiments 10 and 10' the trench 30 have a diffusion margin 33, where the etched trench 30 has been exposed to the dopant diffusion process. This diffusion can occur simultaneously to the formation of the diffused p-n junction at the active region 22. More preferably it is created in a separate diffusion step. The diffusion of the diffusion margin 33 creates a lateral p-n junction converting the margins of the small band-gap layers (14,16, 18 and 20) to p-type material. This effectively prevents the flow of dark current. Care should be taken to create a diffusion margin completely through the absorption layer 16, preferably into the buffer layer 14. The trench 30 is subsequently etched through the diffusion margin 33 into the substrate to isolate the bond pad. The finished device 10, 10' also includes a surface passivation of polyimide, BCB, $SiO_2$ or SiN, which provides further insulation as well as environmental protection. In the devices 10 and 10' details of SiN surface passivation and metal interconnection are not shown for clarity and simplicity of illustration.

Figure 2A:
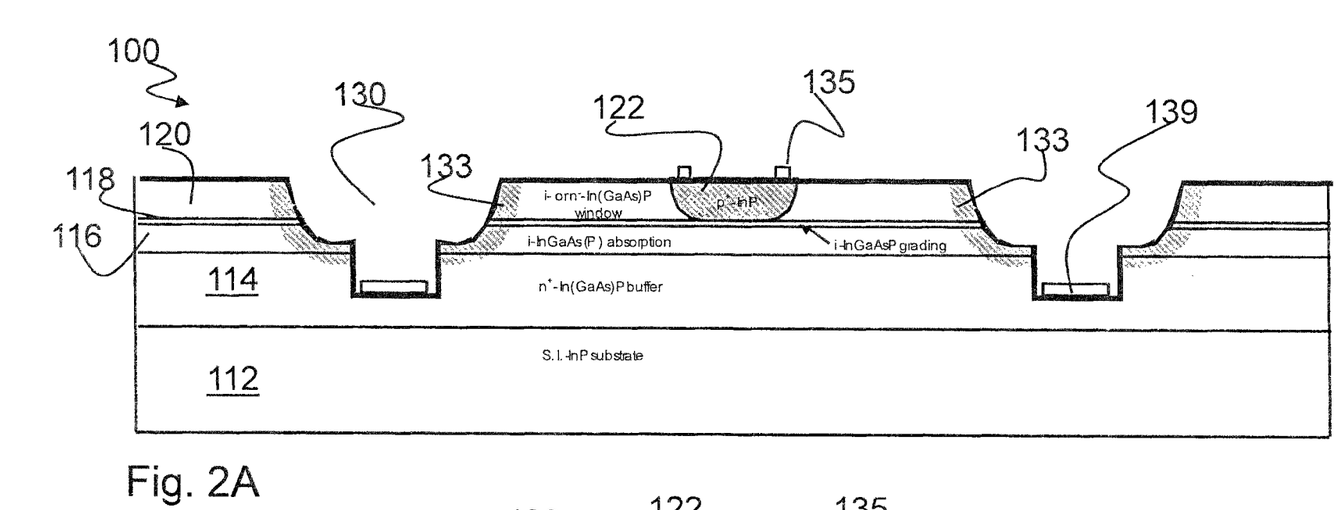
FIG. 2A is a schematic illustration of a mesa diffusion PIN photodiode with two top contacts in accordance with the present invention, shown in cross-section.
Figure 2B:
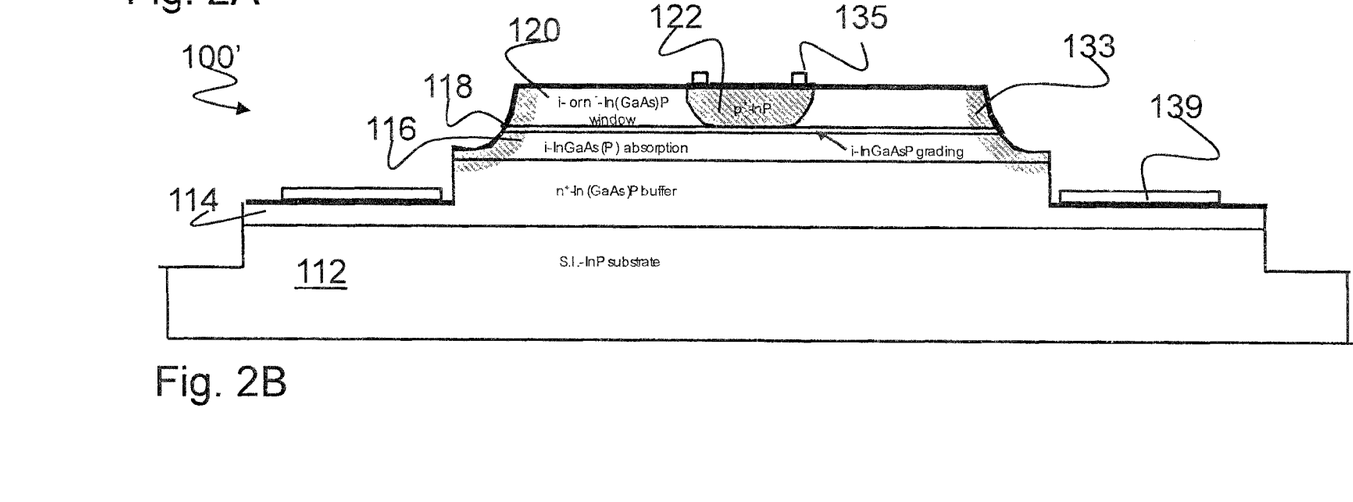
FIG. 2B is a schematic illustration of an alternative configuration of the photodiode shown in FIG. 2A.

FIGS. 2A and 2B illustrate alternative structures 100, 100' of a mesa diffusion PIN having two top contacts. In each case 100, 100' the diode is grown on an S.I. InP substrate. The S.I. substrate is advantageous for creating diodes with a smaller capacitance and less crosstalk. An epitaxial layer structure is grown on the substrate 112 as follows: an n+InP or InGaAsP buffer layer 114, an intrinsic InGaAs or InGaAsP absorption layer 116, an intrinsic InGaAsP grading layer 118, and in intrinsic or n–InGaAsP or InP window layer 120. The window layer 120 includes a diffused p-n junction of p+InP active region 122. A ring shaped p contact 135 and n-contact 139 are both positioned on top surfaces of the device. Ring shaped trench 130 defines the mesa structure. Diffusion margins 133 define lateral p-n junctions terminating the small-band gap layers (114, 116, 118 and 120). The trench 130 is etched below the diffusion margins 133 for placement of the n contact 139. In the devices 100 and 100' details of SiN surface passivation and metal interconnection are not shown for clarity and simplicity of illustration.

Preferred diffusion materials include zinc, cadmium, carbon, magnesium and beryllium among others. By performing the diffusion of the diffusion margins and the active region as separate steps, better control of the diffusion profile of the p-n junction can be insured. Furthermore, by performing diffusion of the diffusion margins first, the dopant in the diffusion margins can penetrate deeper during the second diffusion step. The depth of diffusion should be deep enough to eliminate the impact of sidewall defects from etch, for example, greater than 0.2 µm when mesa is formed by wet etch, or greater than 1 µm when mesa is formed by dry etch.

The method of making the mesa type diffusion PIN photodiodes is outlined in the process flow shown in FIGS. 3A-E.

Figure 3A:
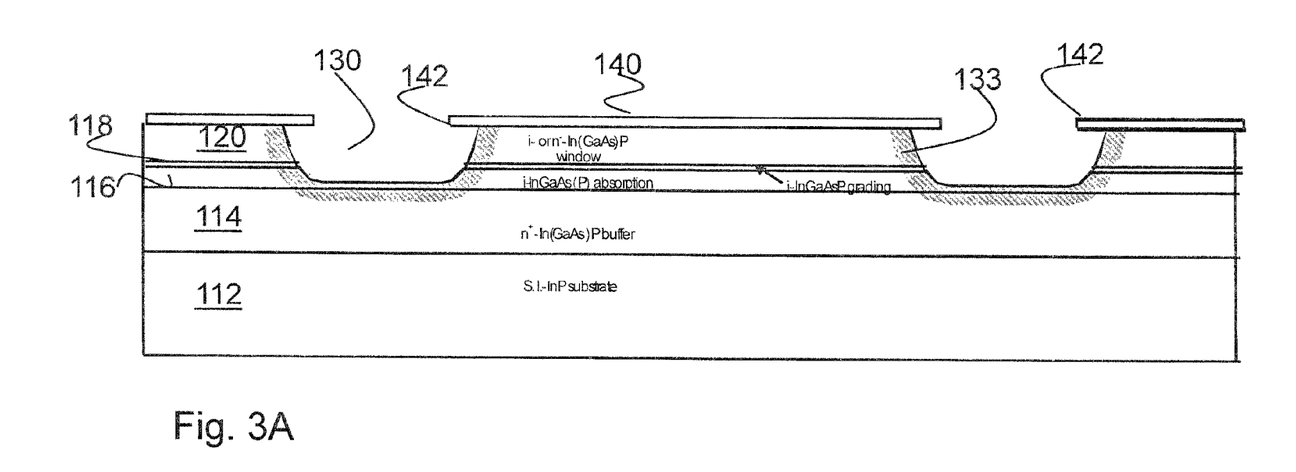

As shown in FIG. 3A, the epitaxial layer stack as in device 100, has been deposited with a protective layer of SiN 140. In the protective layer 140 window 142 has been opened by dry or wet chemical etching. Wet or dry chemical etching is then used to etch away the semiconductor layers to form a ring shaped trench 130. A first diffusion step has created diffusion margins 133.

Figure 3B:
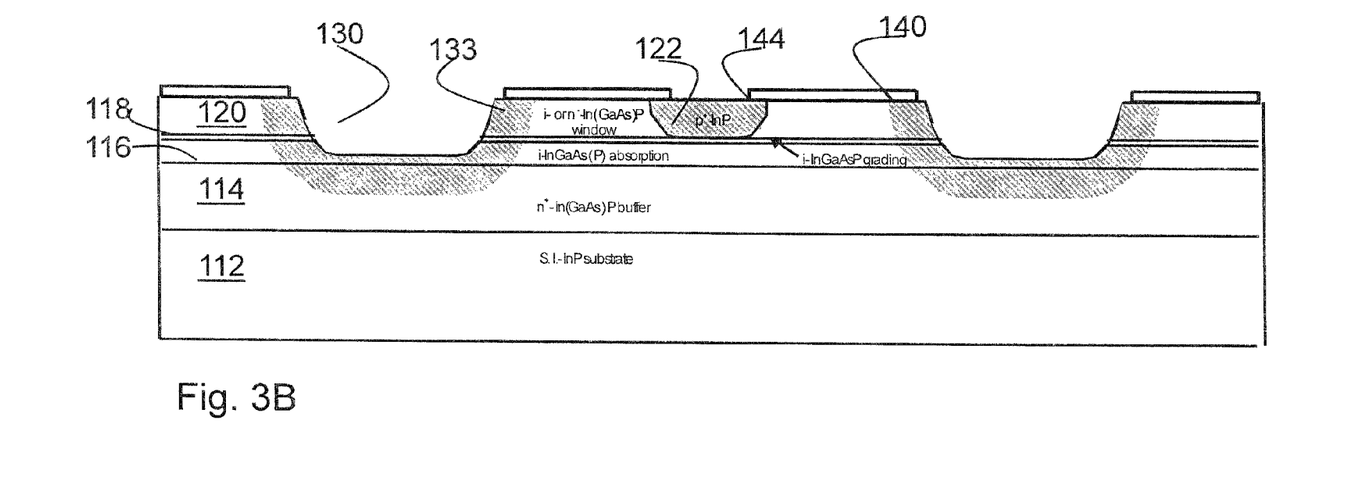

As shown in FIG. 3B, a second window 144 is opened in the protective layer 140. A second diffusion step provides dopant to create the diffused active region 122, simultaneously providing a second diffusion to the diffusion margins 133.

Figure 3C:
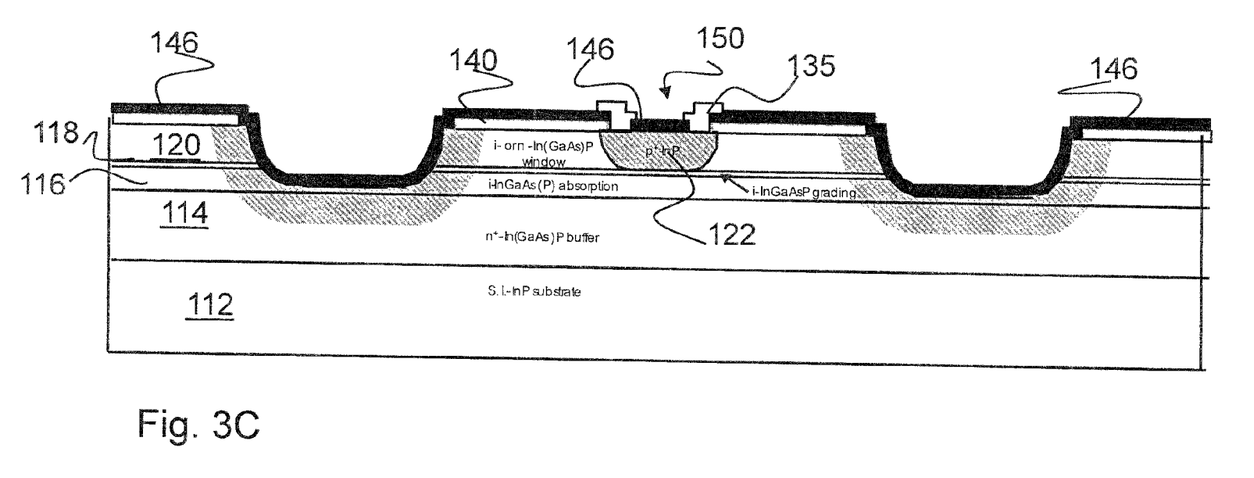

FIG. 3C shows the deposit of an anti-reflection coating 146 over the window 144, as well as over the diffusion margins 133 and protective layer 140. A ring shape is etched through the anti-reflection coating 146 in order to apply p-metal as the p-contact ring 135 with an anti-reflection coating 146 over a light input window 150 of the device.

Figure 3D:
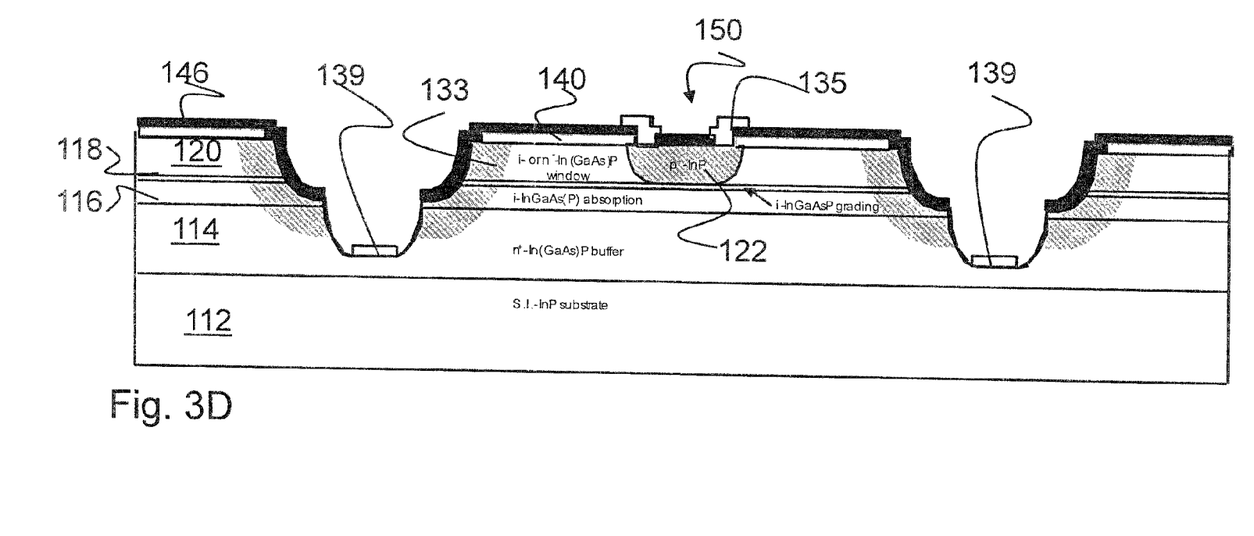

As seen in FIG. 3D, a further etch in the trench 130 passes through the diffusion margin 133. An n-metal is applied in the trench 130 as the n-contact 139.

Figure 3E:
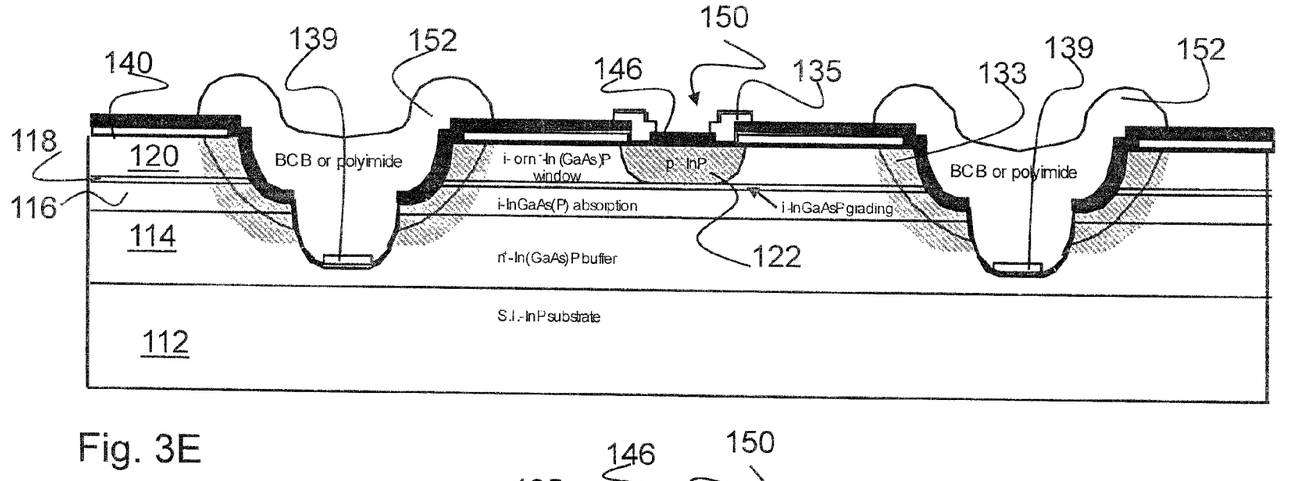

Finally, a surface passivation coating 152 of BCB or polyimide is applied over the surface of the trench 130 surrounding the n-contact 139.

Figure 4:
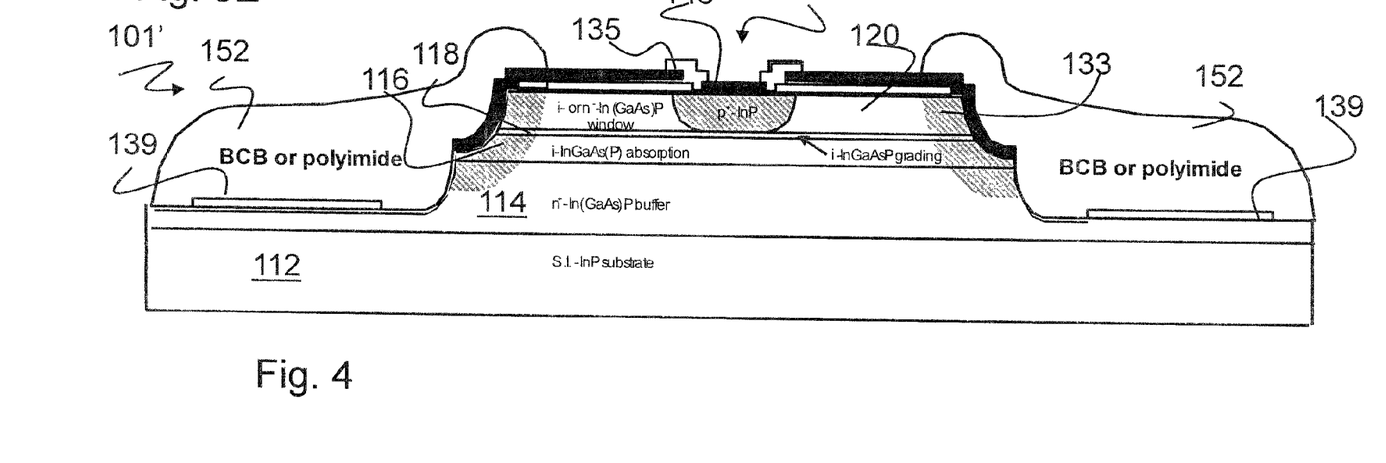
FIG. 4 is a schematic illustration of an alternative embodiment in accordance with the present invention.
Figure 5:
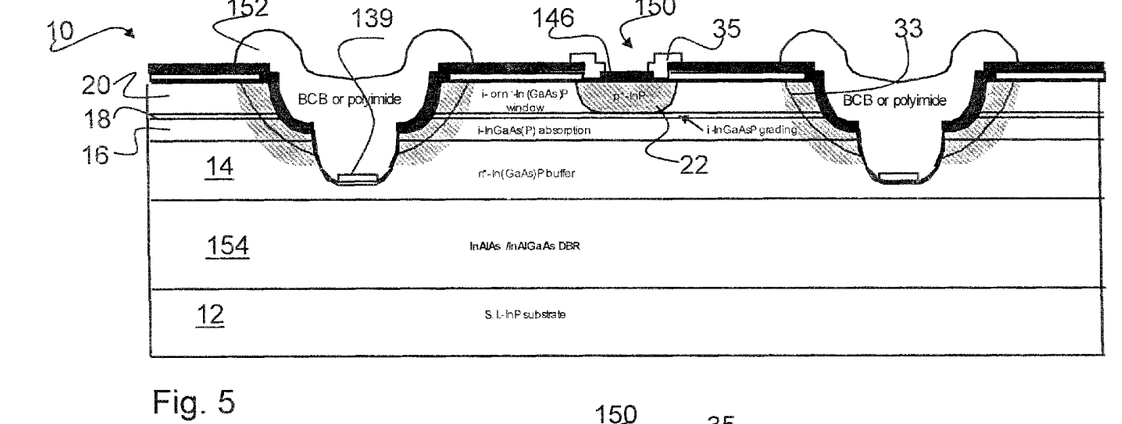
FIG. 5 is a schematic illustration of a further alternative embodiment in accordance with the present invention.
Figure 6:
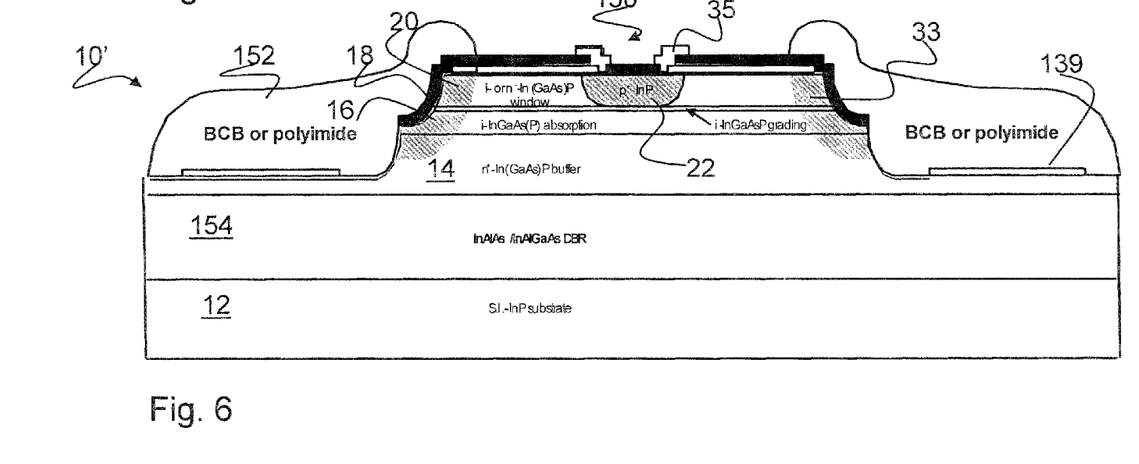
FIG. 6 is a schematic illustration of a still further alternative embodiment in accordance with the present invention.

FIG. 4 illustrates a finished device 101' including a surface passivation layer 152. Alternatively device 10 is shown in FIG. 5 with a surface passivation layer 152. In this case the device 10 further includes a reflector 154, such as an InAlAs or InAlGaAs distributed Bragg reflector (DBR), to enhance responsivity. Also, as shown in FIG. 6, is device 10' including a surface passivation layer 152. This embodiment is also illustrated with a reflector 154, of InAlAs or InAlGaAs DBR. A bottom illuminated device can include a reflector of metal or dielectric on top of the multiplication layer to redirect light into the active region 22 to enhance responsivity. The bottom illuminated device can also include an etched lens on the substrate surface to facilitate light coupling to the active area, as is understood in the art.

The embodiment(s) of the invention described above is(are) intended to be exemplary only. The scope of the invention is therefore intended to be limited solely by the scope of the appended claims.

What is claimed is:

1. A mesa-type PIN photodiode comprising:
    an epitaxial semiconductor layer structure including the following layers over a substrate: a buffer layer; an absorption layer; a grading layer; and a window layer;
    a mesa structure, including a light input window to a diffused p-n junction in the window layer, the mesa defined by a trench through the epitaxial layers, the mesa having sidewalls in the trench, and the side walls including a diffusion margin of p-type material terminating the lateral extent of the epitaxial layers of the mesa wherein the diffused margin comprises a diffused lateral p-n junction for terminating the epitaxial layers;
    a p-contact disposed for electrical contact to the p-n junction; and
    an n-contact disposed for electrical contact to the p-n junction.

2. A mesa-type PIN photodiode as defined in claim 1, wherein the diffused margin fully terminates the absorption layer, grading layer and window layer.

3. A mesa-type PIN photodiode as defined in claim 2, wherein the diffused margin penetrates into the buffer layer.

4. A mesa-type PIN photodiode as defined in claim 1, wherein the diffusion margin has a depth sufficient to eliminate the effects of sidewall defects caused by etching.

5. A mesa-type PIN photodiode as defined in claim 4, wherein the diffusion margin is at least 0.2 microns to about 1 micron in depth.

6. A mesa-type PIN photodiode as defined in claim 1 further including a reflector for increasing the responsivity of the photodiode.

7. A mesa-type PIN photodiode as defined in claim 6, wherein the photodiode is a top illuminated mesa-type PIN photodiode, and the reflector comprises a distributed Bragg reflector over the substrate.

8. A mesa-type PIN photodiode as defined in claim 6, wherein the photodiode is a bottom illuminated mesa-type PIN photodiode, and the reflector comprises a metal or dielectric reflector on the window layer surface.

9. A mesa-type PIN photodiode as defined in claim 8, wherein the bottom illuminated mesa-type PIN photodiode further includes a lens etched in the substrate to facilitate light coupling to the diffused p-n junction.

10. A mesa-type PIN photodiode as defined in claim 1, wherein the epitaxial semiconductor layer structure is selected from the group consisting of the following materials:
    the substrate comprises n+InP or Semi-Insulating InP; the buffer layer comprises n+InP or InGaAsP; the absorption layer comprises intrinsic InGaAs or InGaAsP; the grading layer comprises intrinsic InGaAsP and the window layer comprises n- or intrinsic InGaAsP or InP.

11. A mesa-type PIN photodiode as defined in claim 10, wherein a dopant selected from the group consisting of: zinc, cadmium, carbon, magnesium, beryllium forms the diffused p-n junction and the diffusion margin.

* * * * *